United States Patent [19]

Davis

[11] Patent Number: 5,036,222

[45] Date of Patent: Jul. 30, 1991

[54] OUTPUT BUFFER CIRCUIT WITH OUTPUT VOLTAGE SENSING FOR REDUCING SWITCHING INDUCED NOISE

[75] Inventor: Jeffrey B. Davis, Raymond, Me.

[73] Assignee: National Semiconductor Corporation, Santa Clara, Calif.

[21] Appl. No.: 483,931

[22] Filed: Feb. 22, 1990

[51] Int. Cl.$^5$ ............... H03K 17/16; H03K 19/094; H03K 5/12; H03K 19/017
[52] U.S. Cl. .................................... 307/443; 307/451; 307/542; 307/572; 307/547; 307/548; 307/263
[58] Field of Search ............... 307/443, 542, 572, 448, 307/451, 452, 585, 552, 555, 558, 568, 592, 594, 547, 246, 263, 242

[56] References Cited

U.S. PATENT DOCUMENTS

| | | | |
|---|---|---|---|
| 4,918,339 | 4/1990 | Shigeo et al. | 307/443 X |
| 4,954,729 | 9/1990 | Urai | 307/263 X |
| 4,961,010 | 10/1990 | Davis | 307/443 |

Primary Examiner—Stanley D. Miller
Assistant Examiner—David R. Bertelson
Attorney, Agent, or Firm—Lee Patch; Daniel Kane

[57] ABSTRACT

An output buffer for reducing switching induced noise in high speed integrated circuit devices incorporates a relatively small current carrying capacity secondary pulldown transistor element with the current path first and second terminal leads coupled in parallel with the current path first and second terminal leads of the primary pulldown transistor element. A first output voltage sensing switching circuit is coupled in series between the control terminal leads of the secondary and primary pulldown transistor elements. The secondary pulldown transistor element control terminal lead is coupled in the output buffer to receive a signal propagating through the output buffer first. A relatively small discharge current is therefore initiated from the output before turn on of the relatively large discharge current of the primary pulldown transistor element. The first output voltage sensing switching circuit delays turn on of the primary pulldown transistor element until a threshold voltage below high potential is reached at the output. As result ground bounce and undershoot are each divided into two spikes and the ground rise in potential is constrained to approximately one half that of conventional ground bounce levels. A secondary pullup transistor element with associated noise reduction components can similarly be used on the supply side to reduce $V_{cc}$ droop and overshoot including a second output voltage sensing switching circuit.

25 Claims, 3 Drawing Sheets

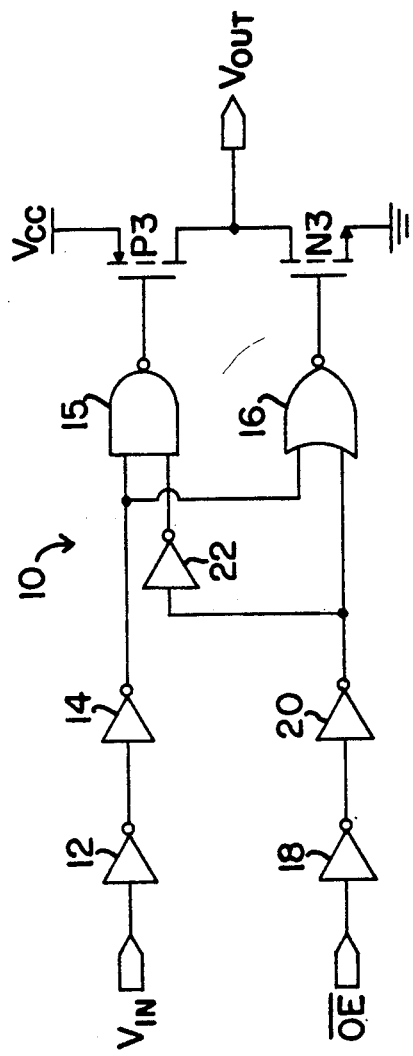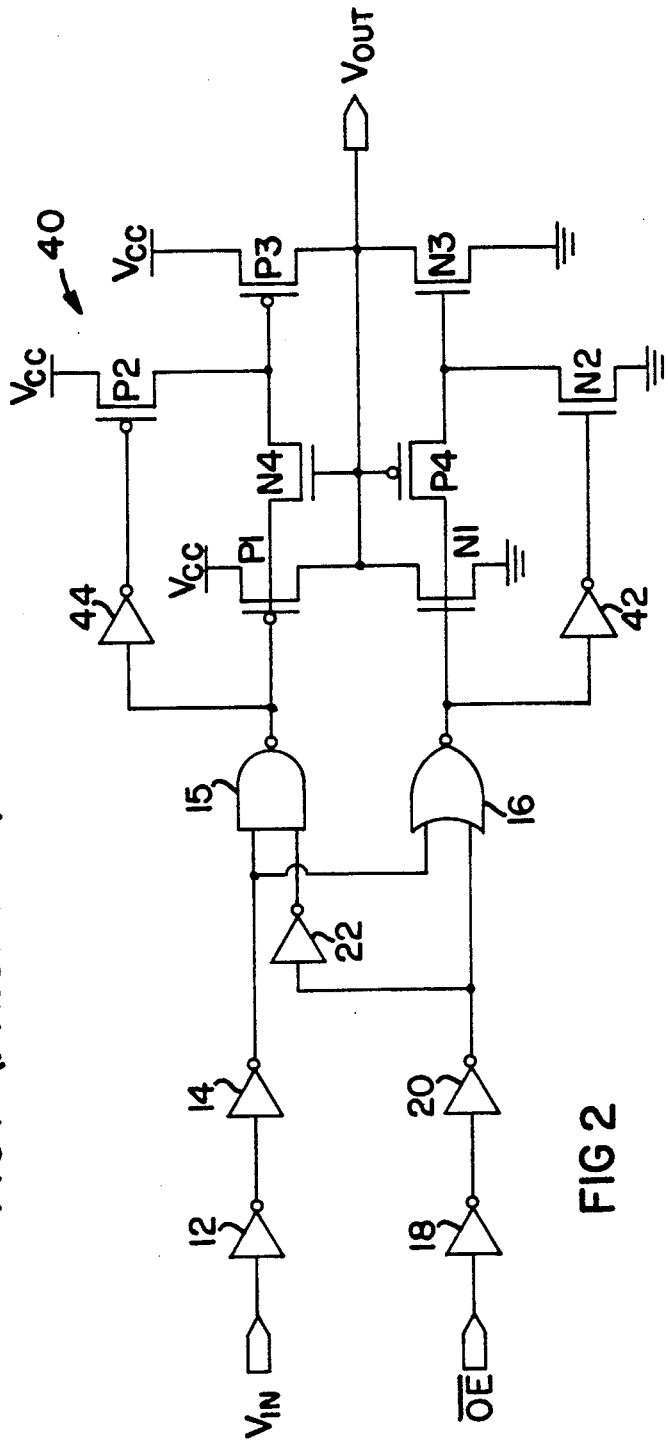
FIG 1 (PRIOR ART)
FIG 2

OUTPUT BUFFER CIRCUIT WITH OUTPUT VOLTAGE SENSING FOR REDUCING SWITCHING INDUCED NOISE

TECHNICAL FIELD

This invention relates to a new output buffer circuit for reducing switching induced noise in high speed digital integrated circuit devices. The invention reduces noise during high to low and low to high transitions at the loaded output of the device. The invention is particularly applicable for multiple output devices driving relatively large loads on a common bus and generally for applications with large load capacitance. For example, the invention provides low noise output buffers for octal buffer line drivers.

BACKGROUND ART

The basic integrated circuit output buffer includes an input for receiving data signals of high and low potential, an output for delivering data signals propagated through the output buffer, and intermediate circuit elements which may include amplifier stages and predrivers. A signal at the input propagates through the data path defined by the intermediate circuit elements to the output with a characteristic propagation delay. A relatively large current carrying capacity primary pulldown transistor element is coupled at the output for sinking discharge current from the output to ground. A relatively large current carrying capacity primary pullup transistor element is coupled at the output for sourcing charging current to the output from a power supply.

In both MOS and bipolar integrated circuit output buffers and devices, the pulldown transistor element initiates a relatively large sinking current from the output to external ground for discharging the output load capacitance during transition from high to low potential at the output. The surge or acceleration of charge develops a voltage across the output ground lead inductance proportional to L di/dt. This potential difference generated by switching outputs results in a positive ground rise in potential at the static low outputs. This output ground bounce may typically be in the order of 0.5 to 3.5 volts above the external ground 0 volts for high output drive circuits with output levels switching between $V_{cc}$ and ground. Deceleration of the initial surge of sinking current develops another voltage across the output ground lead inductance causing a ground voltage undershoot in the output lead of opposite polarity from the ground bounce. The absolute value of the negative ground undershoot spike may be as great as or greater than the positive ground bounce spike.

Similarly in both MOS and bipolar output circuits, the pullup transistor element initiates a relatively large sourcing current from a power supply to the output for charging the output load capacitance during transition from low to high potential at the output. The initial surge or acceleration of sourcing current charge develops a voltage across the output power supply lead inductance proportional to L di/dt resulting in a drop in the output voltage at the static high output. This drop in the output voltage is referred to as supply voltage droop or $V_{cc}$ drop. Power supply voltage droop may be as great as for example 0.5 to 3.5 volts below the external supply voltage in high output drive circuits with output levels switching between $V_{cc}$ and ground. Deceleration of the surge of sourcing current charge through the pullup transistor element develops another voltage across the output supply lead inductance causing an output supply voltage overshoot of potential in the output lead of opposite polarity from the $V_{cc}$ droop. The positive spike of the $V_{cc}$ overshoot above the external supply voltage may be as great as the absolute value of the negative spike of $V_{cc}$ droop in the output lead.

The disruptive effects of this noise on the output ground and supply leads include pulsing of noise on input and internal circuit ground and power supply lines; radio frequency radiation interference (RFI) and electromagnetic induction interference (EMI) noise which may interfere with a host system; local shifts in the reference voltages for high and low potential data signals causing false data signals; and crosstalk with other outputs on a common bus. For example, a low output on an octal buffer line driver common bus may experience a rise with ground bounce causing a false high signal. These problems associated with output ground and supply noise are of increased concern in recent integrated circuits switching higher currents at higher speeds.

The phrase "transistor element" is used herein to refer to integrated circuit transistors from different IC technologies including MOS transistors such as NMOS, PMOS and CMOS transistor elements, and bipolar transistors including, for example, NPN and PNP transistor elements in transistor-transistor logic (TTL) and emitter coupled logic (ECL) circuits. The transistor elements are generically characterized as having a primary current path with primary current path first and second terminal leads or electrodes, and a third control terminal lead or electrode for controlling the conducting state of the primary current path. In the case of an NMOS transistor element, for example, the primary current path first terminal lead is the drain lead, the second terminal lead is the source lead, and the third control terminal lead is the gate lead, etc. In the case of a bipolar NPN transistor element, the primary current path first terminal lead is the collector lead, the second terminal lead is the emitter lead, and the control terminal lead is the base lead, etc. In the case of PMOS and PNP transistor elements, the role of the first and second terminal leads are the inverse from that of the NMOS and NPN transistor elements respectively.

An earlier U.S. Pat. No. 4,961,010, filed May 19, 1989 by the present inventor, describes an improvement upon the basic output buffer. A relatively small current carrying capacity secondary pulldown transistor element is coupled with its current path first and second terminal leads in parallel with the current path first and second terminal leads of the primary pulldown transistor element. A separate pulldown delay resistance element of selected value is operatively coupled in series between the control terminal leads of the secondary and primary pulldown transistor elements.

The secondary pulldown transistor element control terminal lead is coupled in the output buffer to receive a signal propagating through the output buffer after the characteristic propagation delay and before the primary pulldown transistor element control terminal lead. The secondary pulldown transistor element therefore initiates a relatively small discharge current from the output before turn on of the relatively large discharge current of the primary pulldown transistor element. The separate pulldown delay resistance element value is selected for turning on the primary pulldown transistor element a specified time constant delay after the secondary pulldown transistor element during transition from high to low potential at the output.

A feature of the arrangement set forth in U.S. Pat. No. 4,961,010 is that the early turn on of a small current carrying capacity secondary pulldown transistor element initiates pulldown at the output and sinking of current from the output at only a small current sinking level. The initial sinking current level and the charge acceleration are constrained by the size and internal resistance of the small current carrying capacity transistor element. As a result the positive ground rise of potential proportional to L di/dt is also constrained to a lower level, typically less than one half that of a conventional output buffer. Subsequent ground undershoot is similarly less. It is noted that the small sinking current is initiated only after the full propagation delay of an input signal propagating through the data path of the intermediate circuit elements to the output of the buffer circuit.

The separate pulldown delay resistance element and the parasitic capacitance of the primary pulldown transistor element form an RC delay network which delays turn on of the primary or large current carrying capacity pulldown transistor element. This delay is determined by the selected resistance value of the pulldown delay resistance element and consequent time constant of the RC delay network. An advantage of this arrangement is that the small secondary sinking current continues to discharge the charge stored in the output load capacitance during the time constant delay. Upon turn on of the primary large current carrying capacity pulldown transistor element a second positive ground rise of potential occurs. However, the second ground bounce is now also limited by the reduction in charge in the output load capacitance already effected by the early small secondary sinking current. The reduced sinking current level and charge level also constrains and limits subsequent ground undershoot.

According to U.S. Pat. No. 4,961,010, the ratio of current carrying capacities of the primary and secondary pulldown transistor elements and the value of the pulldown delay resistance element are selected to achieve the following objective. The first positive ground rise in potential (first ground bounce) caused by early turn on of the secondary pulldown transistor element, and the second positive ground rise in potential (second ground bounce) caused by later turn on of the primary pulldown transistor element are arranged to be substantially equal by the selection of parameter values. The prior application provides a new method and new IC structure for minimizing the positive ground bounce spike by dividing or bifurcating the ground bounce spike into two components. The two component spikes are equalized by adjusting the values of mask programmable separate components at the output. As a result, the two phase, two step or bifurcated turn on component ground spikes may be limited to a noise level typically less than half that of conventional output buffers.

In the circuit of U.S. Pat. No. 355,509 the ratio of current carrying capacities of the primary to secondary pulldown transistor elements is at least approximately 4 to 1 with a discrete delay resistor having a value of for example 5K ohms to equalize and minimize the component first and second ground bounce spikes. Typically the ratio of current carrying capacities of the primary to secondary pulldown transistor elements is in the range of approximately 4/1 to 7/1. In the case of MOS transistor elements this is accomplished by setting the ratio of the channel widths at the primary to secondary pulldown transistor elements at approximately at least 4 to 1, and in the range of 4/1 to 7/1 etc.

In order to accelerate turn off of the primary pulldown transistor element during the reverse transition from low to high potential at the output, the circuit of U.S. Pat. No. 4,961,010 provides a pulldown delay bypass transistor element having its current path first and second terminal leads coupled between the control terminal lead of the primary pulldown transistor element and ground. A pulldown delay bypass control circuit operatively couples the control terminal lead of the bypass transistor element to the control terminal lead of the secondary pulldown transistor element. This permits bypassing the pulldown delay resistance element for rapid turn off of the primary pulldown transistor element during transition from low to high potential at the output. Typically the bypass control circuit incorporates an inverting element for applying the proper polarity signal to the control terminal lead of the bypass transistor element.

U.S. Pat. No. 4,961,010 describes similar measures for reducing noise on the supply rail side of the output buffer. A relatively small current carrying capacity secondary pullup transistor element is coupled with its primary current path first and second terminal leads in parallel with the current path first and second terminal leads of the primary pullup transistor element. A separate pullup delay resistor element of selected resistance value is coupled in series between the control terminal leads of the secondary and primary pullup transistor elements.

The secondary pullup transistor element control terminal lead is coupled in the output buffer to receive a signal propagating through the output buffer after the characteristic propagation delay, but before the primary pullup transistor element control terminal lead. The secondary pullup transistor element initiates a relatively small charging current from a power supply to the output before turn on of the relatively large charging current of the primary pullup transistor element during transition from low to high potential at the output. The discrete delay pullup resistor element resistance value is selected for turning on the primary pullup transistor element a specified time constant delay after the secondary pullup transistor element.

The ratio of the current carrying capacities of the primary and secondary pullup transistor elements and the value of the pullup delay resistance element are selected to achieve the similar objective of bifurcating both the power droop and subsequent overshoot. The first negative power droop in potential (first $V_{cc}$ droop) caused by turn on of the secondary pullup transistor element, and the second negative power droop in potential (second $V_{cc}$ droop) caused by later turn on of the primary pulldown transistor element are arranged to be substantially equal by the selection of parameter values. To this end the ratio of current carrying capacities of the primary to secondary pullup transistor elements at least approximately 4 to 1 and preferably in the range of 4/1 to 7/1, with a separate delay resistor element having a value of for example one thousand ohms (1K ohms). For rapid turn off of the pullup transistor element during the transition from high to low potential at the output, a pullup delay bypass transistor element and pullup delay bypass control circuit bypass the pullup delay resistor element.

In a typical output buffer line driver the characteristic propagation delay of a signal from the input to the output is, for example, 4 ns, operating into a standard load capacitance of, for example, 50 pf. Using the circuit of U.S. Pat. No. 4,961,010, the ground bounce or rising ground voltage may be constrained to one half the conventional value without substantial additional increase in switching speed propagation delay. Such circuits are referred to herein as bifurcated turn on (BTO) output buffer circuits.

OBJECTS OF THE INVENTION

It is an object of the present invention to provide improved circuit arrangements for implementing the concept of two phase, two step, or bifurcated turn on of sinking and sourcing currents in output buffer circuits for reducing switching induced noise. The new circuit arrangements similarly divide and reduce the peaks of ground bounce and undershoot and $V_{cc}$ droop and overshoot events by preceding the relatively large primary sinking and sourcing currents with early small secondary sinking and sourcing currents.

Another object of the invention is to sense the voltage level at the output of output buffer circuits during switching transitions. After initiating the early small secondary sinking or sourcing current, the relatively large primary sinking or sourcing current is then initiated upon detection of a selected threshold voltage level at the output.

The object of the invention is to bifurcate and phase the turn on of the output pulldown and pullup transistor elements of an output buffer circuit. By sensing the voltage level at the output after initiating an early small secondary sinking or sourcing current, the large primary sinking or sourcing current can be initiated according to the voltage level sensed at the output.

Yet another object of the invention is to implement bifurcated turn on output buffer circuits without the necessity of RC delay networks so that the primary sinking and sourcing currents are initiated at the end of the standard propagation delay without any further RC time constant delay.

DISCLOSURE OF THE INVENTION

In order to accomplish these results the present invention provides an improvement upon the basic output buffer. A relatively small current carrying capacity secondary pulldown transistor element is coupled with its current path first and second terminal leads in parallel with the current path first and second terminal leads of the relatively large current carrying capacity primary pulldown transistor element. According to the invention a first output voltage sensing switching circuit is coupled in series between the control terminal leads of the secondary and primary pulldown transistor elements for controlling the conducting state of the primary pulldown transistor element according to the voltage level at the output.

The secondary pulldown transistor element control terminal lead is coupled in the output buffer circuit to receive a signal propagating through the output buffer circuit before the primary pulldown transistor element control terminal lead. The secondary pulldown transistor element therefore initiates a relatively small discharge current from the output before turn on of the relatively large discharge current of the primary pulldown transistor element. The primary pulldown transistor element is then turned on by the first output voltage sensing switching circuit.

The first output voltage sensing switching circuit is responsive to the output voltage level for turning on the primary pulldown transistor element. The first output voltage sensing switching circuit turns on the primary pulldown transistor element during transition from high to low potential at the output, when the output voltage level falls to a first threshold voltage level below high potential. For example, the first output voltage sensing switching circuit may be constructed and arranged for turning on the primary pulldown transistor element when the output voltage falls approximately one volt below high potential $V_{cc}$.

In the preferred circuit embodiment of the invention, the ratio of current carrying capacities of the primary to secondary pulldown transistor elements is at least approximately 4/1 and preferably in the range of approximately 4/1 to 7/1. For implementation with MOS transistor elements with fixed channel lengths, the ratio of channel widths of the primary to secondary pulldown transistor elements is therefore also at least approximately 4/1 and preferably in the range of approximately 4/1 to 7/1.

If the primary and secondary pulldown transistor elements are NMOS transistor elements, the preferred first output voltage sensing switching circuit is a PMOS transistor element having current path first and second terminal leads coupled in series between the control terminal leads of the secondary and primary pulldown transistor element. The third control terminal lead of the PMOS transistor element is coupled to the output for sensing the output voltage level. A feature of this arrangement is that the output voltage sensing PMOS transistor element switch becomes conducting during transition from high to low potential at the output when the output voltage level falls to a voltage difference from high potential equal to the turn on voltage of the PMOS transistor element. For example, the PMOS transistor element becomes conducting when the output voltage level has fallen approximately one volt below the high potential $V_{cc}$. The control signal may therefore propagate from the control terminal lead of the secondary pulldown transistor element to the control terminal lead of the primary pulldown transistor element. The primary pulldown transistor element therefore becomes conducting to complete the discharge of load capacitance at the output.

The present invention therefore achieves the objective of bifurcated turn on of the pulldown transistor elements and discharge of charge stored in the load capacitance in two steps as in U.S. Pat. No. 4,961,010. The ground noise spikes of ground bounce and ground undershoot are therefore bifurcated into first and second bounce events and undershoot events at substantially 50% the noise level of conventional circuits.

This is accomplished according to the present invention however without the necessity of using a separate pulldown delay resistance element and accompanying RC time constant delay in signal propagation. Furthermore the circuit of the present invention is self-adjusting in bifurcating noise spikes into two subsidiary spikes of substantially equal value for large load capacitance applications. For large load capacitance applications, with greater charge storage, greater discharge is permitted during the first event before turn on of the primary pulldown transistor element, adjusting for greater load capacitance and greater charge storage at the output.

The invention uses a first voltage sensing circuit at the output for sensing the fall of voltage level at the output during transition from high to low potential. The first voltage sensing circuit also includes an active element switch circuit in the control circuit path between the secondary and primary pulldown transistor elements. Upon reduction of the voltage level at the output during sinking of current by the secondary pulldown transistor element to a selected threshold voltage level, the active switch circuit turns on the primary pulldown transistor element. In the preferred example embodiment a single transistor element such as a PMOS or NMOS transistor element performs both the sensing function of sensing the voltage level at the output, and the active element switching function of permitting control signal propagation to the control terminal lead of the primary pulldown transistor element.

In order to accelerate turn off of the primary pulldown transistor element during the reverse transition from low to high potential at the output, the invention provides a first circuit bypass transistor element having its current path first and second terminal leads coupled between the control terminal lead of the primary pulldown transistor element and ground. A first circuit bypass control circuit operatively couples the control terminal lead of the bypass transistor element to the control terminal lead of the secondary pulldown transistor element. This permits bypassing the first output voltage sensing and switching circuit for rapid turn off of the primary pulldown transistor element during transition from low to high potential at the output. Typically the bypass control circuit incorporates an inverting element for applying the proper polarity signal to the control terminal lead of the bypass transistor element.

According to an alternative example embodiment, the first output voltage sensing switching circuit may include one or more amplification stages. For example the output voltage sensing switching circuit may include a CMOS amplifier invertor stage with the common control terminal leads of the CMOS transistor elements coupled to the output. The output of this CMOS amplifier invertor stage may in turn be coupled to the control terminal lead of an NMOS transistor element. The current path first and second terminal leads of the NMOS transistor element are coupled in series between the control terminal leads of the secondary and primary pulldown transistor elements for switching on and off the control signal propagation path to the control terminal lead of the primary pulldown transistor element.

According to another feature of the invention a separate pulldown delay resistance element of selected resistance value may be coupled in series between the control terminal leads of the secondary and primary pulldown transistor elements. The separate pulldown delay resistor element is coupled in parallel with the first output voltage sensing switching circuit. In this manner the circuit can operate in the manner of the circuit of U.S. Ser. No. 355,509 using the RC time constant control signal propagation delay for applications with relatively small output load capacitance for example in the order of 50 pf. For very large load capacitance $C_L$, the output voltage sensing switching circuit such as the PMOS transistor element is able to turn on and bypass the RC time constant delay of the pulldown delay resistance element. Thus for very low noise applications and lightly loaded condition circuits the original circuit arrangement of U.S. Ser. No. 355,509 is operative. On the other hand for excessive delay resulting from large load capacitance charge storage, the output voltage sensing and switching circuit arrangement of the present invention overrides the original circuit and is operative to initiate the large sinking current of the primary pulldown transistor element.

The circuit arrangement of the present invention can be optimized for different load applications. Thus, the ratio of channel widths or more generally the ratio of current carrying capacities of the primary and secondary pulldown transistor elements is adjusted according to the expected output load capacitance $C_L$ of the particular application. The output voltage sensing and switching circuit of the present invention, in parallel with the pulldown delay resistor element, effectively provides an output logic OR gate controlling the primary pulldown transistor element. Either the voltage level at the output falls to the selected threshold voltage level turning on the output voltage sensing switching circuit, which turns on the large current carrying capacity primary pulldown transistor element, or the primary pulldown transistor element turns on after the RC time constant delay of the separate parallel pulldown delay resistance element.

Similar circuit arrangements according to the invention are provided for the supply side of the output buffer circuit. A relatively small current carrying capacity secondary pullup transistor element is coupled with its primary current path first and second terminal leads in parallel with the current path first and second terminal leads of the primary pullup transistor element. A second output voltage sensing switching circuit is coupled in series between the control terminal leads of the secondary and primary pullup transistor elements for controlling the conducting state of the primary pullup transistor element.

The second output voltage sensing switching circuit is similarly responsive to the output voltage level for turning on the primary pullup transistor element during transition from low to high potential at the output at a selected threshold voltage level above the low potential. Similar preferred parameter value arrangements apply to the second output voltage sensing switching circuit on the power supply side of the output buffer circuit. The second output voltage sensing switching circuit may also be applied in parallel combination with a second separate pullup delay resistance element of selected resistance value coupled between the control terminal leads of the secondary and primary pullup transistor elements.

For rapid turn off of the pullup transistor element during the transition from high to low potential at the output, a second circuit bypass transistor element and second circuit bypass control circuit bypass the second output voltage sensing and switching circuit.

Other objects, features and advantages of the invention are apparent in the following specification and accompanying drawings.

BRIEF DESCRIPTION OF THE DRAWINGS

FIG. 1 is a schematic circuit diagram of a prior art MOS output buffer.

FIG. 2 is a schematic circuit diagram of an output buffer circuit with output voltage sensing according to the invention for reducing switching induced noise.

DESCRIPTION OF PREFERRED EXAMPLE EMBODIMENTS AND BEST MODE OF THE INVENTION

Figure 3:
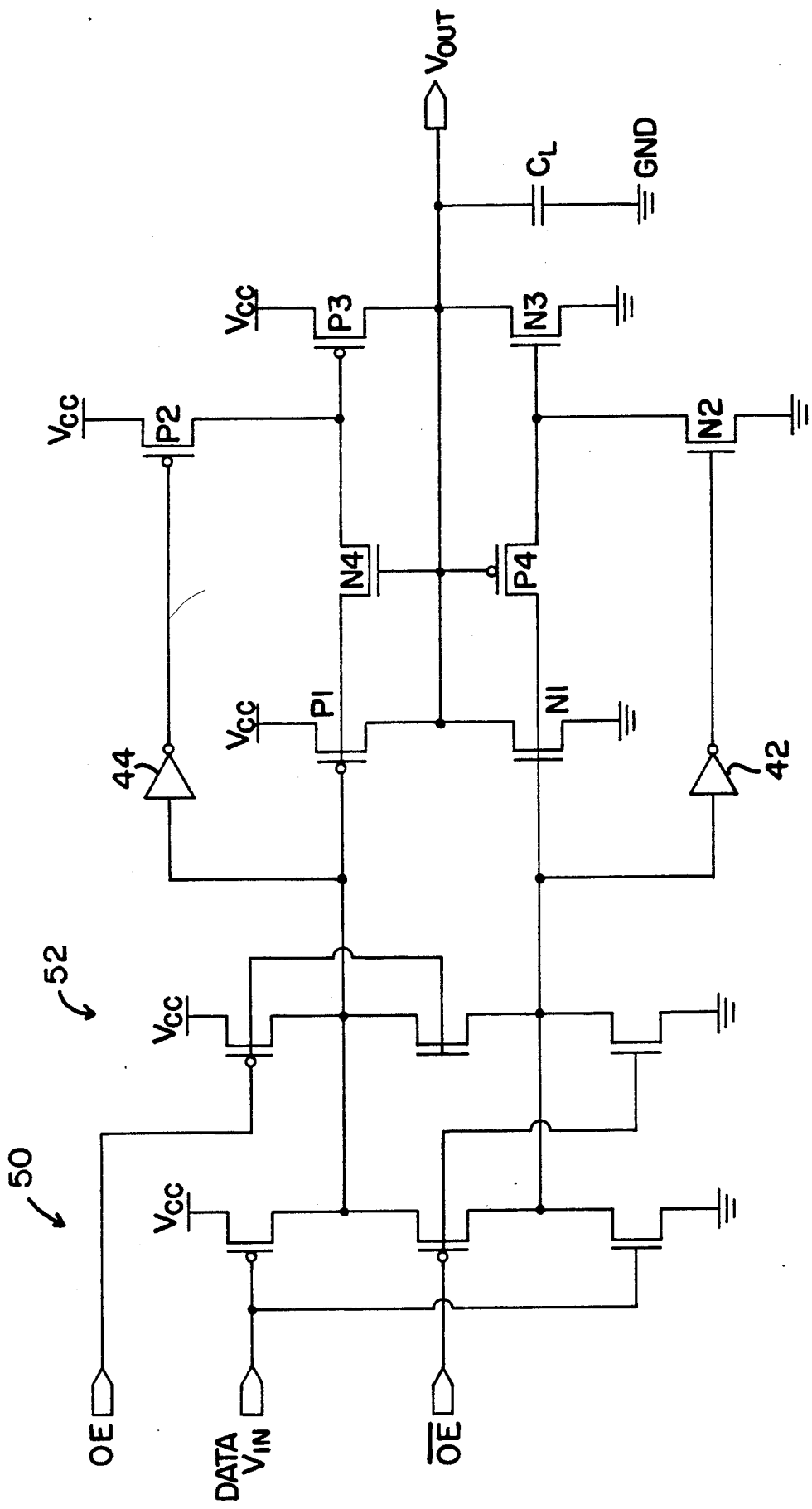
FIG. 3 is a further detailed schematic circuit diagram of an output buffer circuit with output voltage sensing according to the invention.

A conventional prior art MOS transistor output buffer 10 is illustrated FIG. 1. Multiple output buffers of this type may be incorporated, for example, as output buffers in an octal buffer line driver. The pulldown transistor element is provided by the relatively large current carrying capacity NMOS transistor N3. The pullup transistor element is provided by relatively large current carrying capacity PMOS transistor element P3. Output buffer 10 is a non-inverting tristate output device, and data signals propagate from the input $V_{IN}$ to the output $V_{OUT}$. The tristate output enable and disable signals are applied at the OE terminal input.

A data signal at the input $V_{IN}$ passes through two inverting current amplification stages 12, 14 and then is applied at the same polarity as the input to NAND gate 15 and NOR gate 16. NAND gate 15 drives pullup transistor element P3. NOR gate 16 drives the pulldown transistor element N3. The second input to each of the gates 15, 16 is derived from the OE terminal input.

An output enable signal OE is applied in inverted polarity OE at the tristate OE terminal. This tristate signal passes through first and second inverting current amplification stages 18, 20 and is applied at the same polarity as the OE signal to the input of NOR gate 16. The tristate signal also passes through first and second inverting stages of current amplification 18, 20 and a third inverter stage 22 before it is applied to the input of NAND gate 15. The tristate signal applied to the input of NAND gate 15 is thus of opposite polarity from the OE signal and is in phase with output enable signal OE.

The logic gate arrangement of the output buffer 10 of FIG. 1 delivers output data signals of high and low potential at the output $V_{OUT}$ in phase with data signals at the input $V_{IN}$ during bistate operation when the output enable signal OE is high (OE low). When the OE signal is low (OE high) during the high impedance third state, both the pullup transistor element P3 and the pulldown transistor element N3 are disabled. The output $V_{OUT}$ appears as a high impedance to other output buffers on a common bus.

An improved output buffer circuit 40 according to the invention is illustrated in FIG. 2. Integrated circuit elements and components performing the same function as in the output buffer circuit 10 of FIG. 1 are indicated by the same reference numerals or reference designations. Because FIG. 1 is reproduced from U.S. Pat. No. 4,961,010 the MOS transistor symbols there used for PMOS transistor element P3 and NMOS transistor element N3 are incorporated in FIG. 1. In the circuits of the present invention illustrated in FIGS. 2-5, simplified symbols for the PMOS and NMOS transistor elements are used.

In addition to the circuit components and elements in common with FIG. 1, the improved output buffer circuit 40 of FIG. 2 includes the secondary pullup transistor element Pl and secondary pulldown transistor element N1. The secondary pulldown transistor element N1 is coupled with its current path first and second terminal leads in parallel with the first and second terminal leads of the primary pulldown transistor element N3 between the output $V_{OUT}$ and ground. The respective control terminal leads of transistor elements N1 and N3 are coupled in a series circuit with the current path first and second terminal leads of output voltage sensing pulldown control switch transistor element P4. A data signal at the input $V_{IN}$ propagating through the data path of the output buffer circuit therefore first encounters secondary pulldown transistor element N1.

For a transition from high to low potential at the output $V_{OUT}$, a high potential signal appears at the control gate of secondary pulldown transistor element N1, turning on N1 to initiate the relatively small sinking current for discharging the output load capacitance. The control gate terminal lead of output voltage sensing transistor element P4 senses and follows the fall in voltage at the output $V_{OUT}$. When the voltage at the output has dropped by a voltage difference equal to the turn on voltage of transistor element P4, applied across the P4 gate and source terminals, transistor element P4 turns on. Output voltage sensing transistor element P4 also functions as a primary pulldown switch passing the high potential level signal to the gate of primary pulldown transistor element N3. Primary pulldown transistor element N3 conducts, completing discharge of the output load capacitance. Sinking of current from the output and discharge of the output load capacitance is thus accomplished in two steps with "bifurcated turn on" of the respective pulldown transistor elements.

A feature of the first output voltage sensing circuit provided by output voltage sensing and primary pulldown control switch transistor element P4 is that it functions as a positive feedback circuit. The greater the voltage drop at the output, the more P4 conducts, turning on the primary pulldown transistor element N3 "harder", increasing the sinking current, and dropping the output voltage further.

Similarly, on the power supply side of the output buffer circuit, the secondary pullup transistor element Pl is coupled with its current path first and second terminal leads in parallel with the current path terminal leads of the primary pullup transistor element P3 between high potential power supply $V_{cc}$ and the output $V_{OUT}$. The respective control terminal leads of the secondary and primary pullup transistor elements Pl and P3 are coupled in series with the current path first and second terminal leads of output voltage sensing and pullup control switch transistor element N4. A data signal at the input $V_{IN}$ propagating through the data path of the output buffer circuit therefore first encounters the control gate of secondary pullup transistor element P1.

In the case of a low to high potential transition at output $V_{OUT}$, a low potential signal arrives at the control gate of secondary pullup transistor element P1. Transistor element P1 turns on initiating the relatively small sourcing current to initiate charging of the output capacitance. The control gate terminal lead of output voltage sensing transistor element N4 is coupled to the output $V_{OUT}$ and senses and follows the rise in voltage level at the output. When the voltage difference in the rise at the output $V_{OUT}$ equals the turn on voltage of transistor element N4, applied across the N4 gate and source terminals, transistor element N4 turns on. Output voltage sensing transistor element N4 therefore also functions as the primary pullup control switch transistor element passing the low potential signal to the control gate of primary pullup transistor element P3. Primary pullup transistor element P3 becomes conducting and completes the charging of the output capacitance with the relatively large sourcing current, pulling up the output voltage level to high potential. Sourcing of current to the output $V_{OUT}$ and charging of the output capacitance is therefore accomplished in two steps with "bifurcated turn on" of the output pullup transistor elements.

A feature of the second output voltage sensing circuit provided by output voltage sensing and primary pullup control switch transistor element N4 is that it also functions as a positive feedback circuit.

To accelerate turn off of the primary pulldown transistor element N3 during the transition from low to high potential at the output, a pulldown delay bypass transistor element N2 is coupled with the current path first and second terminal leads coupled between the control gate terminal lead of the primary pulldown transistor element N3 and ground. A first bypass control circuit couples the gate terminal lead of the first bypass transistor element N2 to the gate terminal lead of the secondary pulldown transistor element N1. The first bypass control circuit incorporates an inverting amplifier stage 42 for applying the proper polarity signal to the control or gate terminal lead of the bypass transistor element N2. As a result the first output voltage sensing and pulldown control switch circuit provided by transistor element P4 is bypassed for rapid turn off of the primary pulldown transistor element N3 during the transition from low to high potential at the output.

Similarly, to accelerate turn off of the primary pullup transistor element P3 during the transition from high to low potential at the output, a second bypass transistor element P2 is coupled with its current path first and second terminal leads coupled between the control gate terminal lead of primary pullup transistor element P3 and high potential power supply $V_{cc}$. A second bypass control circuit incorporating the inverting amplifier stage 44 couples the control gate terminal lead of the second bypass transistor element P2 to the control gate terminal lead of the secondary pullup transistor element P1. This second bypass circuit bypasses the second output voltage sensing and pullup control switch circuit provided by transistor element N4 for rapid turn off of the primary pullup transistor element P3 during the transition from high to low potential at the output.

The output buffer circuit of FIG. 2 is a non-inverting buffer. For example a high potential data signal appearing at the input $V_{IN}$ results in a high potential data signal at the output $V_{OUT}$. The circuit of the present invention is also illustrated in another non-inverting output buffer as shown in FIG. 3. The same operative components of the output voltage sensing and pullup and pulldown control switch circuits are shown with the same reference numerals and reference designations. The data path of the output buffer circuit of FIG. 3 however incorporates simplified input stages of amplification 50, 52 rather than the sequential inverting amplifier and predriver stages of FIG. 2.

Figure 4:
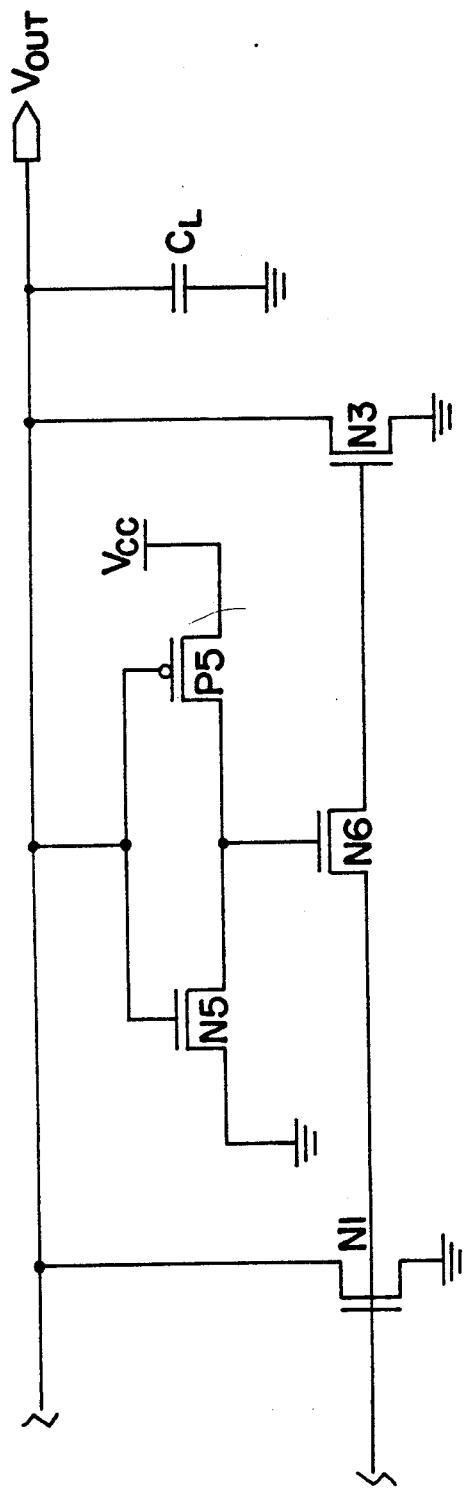
FIG. 4 is a detailed fragmentary schematic circuit diagram of an alternative output voltage sensing and switching circuit using a sense amplifier stage or inverting amplifier stage.

A variation in the output voltage sensing and pulldown control switch circuit for the ground side of the output buffer circuit is illustrated in the fragmentary circuit portion of FIG. 4. The single voltage sensing and switch transistor element P4 of FIGS. 2 and 3 is replaced by an output voltage sensing inverting amplifier stage provided by transistor elements N5 and P5 and an active control switch transistor element N6 in the control gate terminal path of the primary pulldown transistor element N3. As shown in FIG. 4, when the secondary pulldown transistor element N1 is conducting, the sense amplifier N5, P5 senses and follows the drop in voltage at the output $V_{OUT}$ and provides an inverted amplified signal at the control gate of pulldown control switch transistor element N6. When the voltage level at the output $V_{OUT}$, has fallen the desired threshold voltage difference level below high potential $V_{cc}$, the pulldown control switch transistor element N6 becomes conducting passing a high potential signal to the control gate of primary pulldown transistor element N3. Primary pulldown transistor element N3 becomes conducting and completes the discharge and pulldown of the output with a relatively large sinking current. A similar arrangement can be provided on the supply side of the output buffer circuit with a sense amplifier stage in which the positions of the transistor elements N5, P5 are reversed or inverted and in which the pulldown control switch transistor element N6 is replaced with a PMOS pullup control switch transistor element P6. Other circuit arrangements for output voltage sensing and pullup and pulldown control switching can also be provided.

Figure 5:
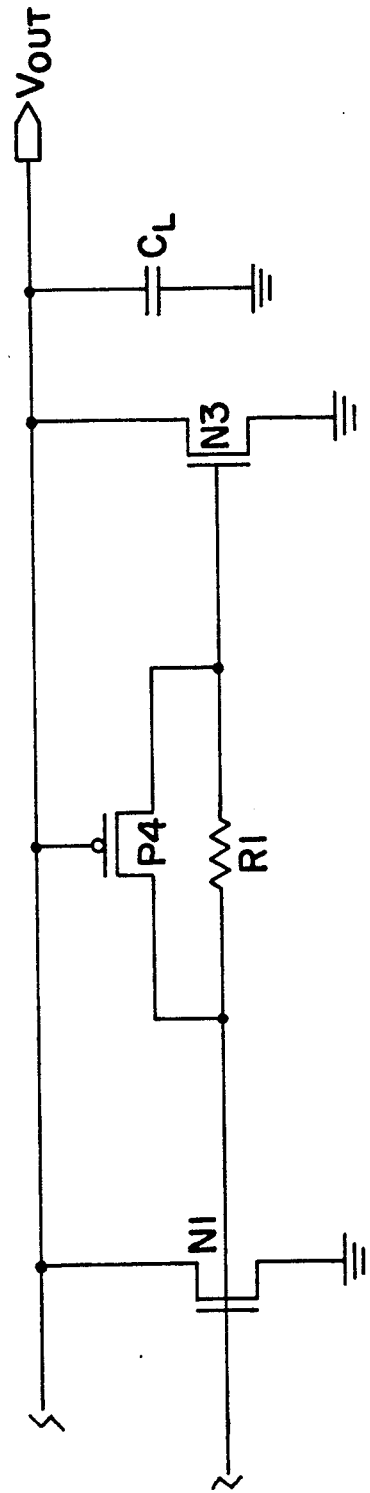
FIG. 5 is a detailed fragmentary schematic circuit diagram of another output voltage sensing switching circuit in parallel combination with a pulldown delay resistance element.

Another alternative output voltage sensing and pulldown control switch circuit for the ground side of the output buffer is illustrated in the fragmentary circuit portion of FIG. 5. In this example the output voltage sensing and pulldown switch circuit is provided by PMOS transistor element P4 as in the examples of FIGS. 2 & 3. However a pulldown delay resistor element R1 of the type, for example described in U.S. Pat. No. 4,961,010 is coupled in parallel with the output voltage sensing and pulldown control switch circuit between the control gate terminal leads of the secondary and primary pulldown transistor elements N1 and N3. The output voltage sensing and pulldown control switching transistor element P4 and the parallel pulldown delay resistor element R1 effectively provide a logical OR for processing switching events at the output and controlling the conducting state of the primary pulldown transistor element N3.

In the case of certain applications with relatively small output load capacitance $C_L$, the secondary pulldown transistor element N1 initiates the small sinking current and the first stage or step of sinking current and the first stage or step of the bifurcated turn on of the pulldown transistor elements. After the RC time constant delay interposed by the RC network of pulldown delay resistor element R1 and the channel capacitance of primary pulldown transistor element N3, a high potential signal passes from the control gate of secondary transistor element N1 to the gate of transistor element N3. Primary pulldown transistor element N3 completes the second step or stage of the bifurcated turn on of the pulldown transistor elements and bifurcated pulldown at the output with the relatively large sinking current.

In the case of a relatively large output load circuit application and relatively large output load capacitance $C_L$, the output voltage sensing transistor element P4 senses and follows the drop in voltage at the output $V_{OUT}$. When the output voltage $V_{OUT}$ falls below high potential $V_{cc}$ a voltage difference equal to the turn on voltage of transistor element P4, the parallel branch of the pulldown switch circuit through transistor element P4 becomes conducting and bypasses the RC network and RC time constant delay. The primary pulldown transistor element N3 turns on promptly to complete discharge of the large output load capacitance with the relatively large sinking current.

Example component values for the operative components for the output buffer circuit of FIGS. 2 & 3 is set forth in the following TABLE 1. The right hand column of TABLE 1 gives respective exemplary channel widths of the PMOS and NMOS transistor elements listed in the column on the left.

TABLE 1

| MOS Transistor Element | Channel Width (meters) |
| --- | --- |
| N1 | $200 \times 10^{-6}$ |
| P1 | $400 \times 10^{-6}$ |
| N2 | $75 \times 10^{-6}$ |
| P2 | $350 \times 10^{-6}$ |
| N3 | $800 \times 10^{-6}$ |
| P3 | $1600 \times 10^{-6}$ |
| N4 | $350 \times 10^{-6}$ |
| P4 | $175 \times 10^{-6}$ |

While the invention has been described with reference to particular example embodiments it is intended to cover all modifications and equivalents within the scope of the following claims.

I claim:

1. An output buffer for reducing switching induced noise in high speed integrated circuit devices, said output buffer having an input for receiving data signals of logic high and low potential levels, an output for delivering data signals propagated through the output buffer, a relatively large current carrying capacity primary pulldown transistor element operatively coupled at the output for sinking a relatively large discharge current from the output to ground, and a relatively large current carrying capacity primary pullup transistor element operatively coupled at the output for sourcing a relatively large charging current to the output from a power supply, each transistor element being characterized by a sourcing or sinking current path between first and second terminal leads, and a third control terminal lead for controlling the conducting state of the current path, the improvement comprising:

a relatively small current carrying capacity secondary pulldown transistor element having its current path first and second terminal leads coupled in parallel with the current path first and second terminal leads of the primary pulldown transistor element;

and a first output voltage sensing active switching circuit coupled in series between the control terminal leads of the secondary and primary pulldown transistor elements, said first output voltage sensing active switching circuit switching between different conducting states in response to the voltage level at the output for controlling the conducting state of the primary pulldown transistor element;

said secondary pulldown transistor element control terminal lead being coupled in the output buffer to receive a signal propagating through the output buffer before the primary pulldown transistor element control terminal lead to initiate a relatively small discharge current from the output before turn on of the relatively large discharge current of the primary pulldown transistor element by the first output voltage sensing active switching circuit;

said first output voltage sensing active switching circuit also being coupled to the output and being responsive to the output voltage level for turning on the primary pulldown transistor element during transition from logic high to low potential levels at the output at a selected first threshold voltage level below said logic high potential level.

2. The output buffer of claim 1 wherein the first output voltage sensing active switching circuit comprises a first output voltage sensing switch transistor element having current path first and second terminal leads coupled in series between the control terminal leads of the secondary and primary pulldown transistor elements, the control terminal lead of said first output voltage sensing switch transistor element being operatively coupled for sensing the voltage level at the output.

3. The output buffer of claim 1 wherein the primary and secondary pulldown transistor elements comprise MOS transistor elements, and wherein the ratio of the channel widths of the primary to secondary pulldown transistor elements and therefore the ratio of current carrying capacities is at least approximately 4/1.

4. The output buffer of claim 3 wherein the ratio of channel widths and therefore current carrying capacities of the primary to secondary pulldown transistor elements is in the range of approximately 4/1 to 7/1.

5. The output buffer of claim 2 wherein the transistor elements comprise MOS transistor elements, wherein the primary and secondary pulldown transistor elements comprise NMOS transistor elements, and wherein the first output voltage sensing active switching circuit comprises a PMOS transistor element having first and second terminal leads coupled in series between the control terminal leads of the secondary and primary pulldown transistor elements and having the third control terminal lead coupled to the output for sensing the output voltage level.

6. The output buffer of claim 1 further comprising a separate pulldown delay passive resistance element of selected resistance value operatively coupled in series between the control terminal leads of the secondary and primary pulldown transistor elements and in parallel with said first output voltage sensing active switching circuit.

7. The output buffer of claim 6 wherein the pulldown delay passive resistance element comprises a P+ diffused resistor element.

8. The output buffer of claim 1 wherein the ratio of current carrying capacities of the primary and secondary pulldown transistor elements and the value of the first threshold voltage level are selected so that the first positive ground rise in potential (first ground bounce) caused by turn on of the secondary pulldown transistor element and the second positive ground rise in potential (second ground bounce) caused by turn on of the primary pulldown transistor element, are substantially equal.

9. The output buffer of claim 2 wherein the first output voltage sensing active switching circuit comprises an amplifier stage coupled between the output and the control terminal lead of said first output voltage sensing switch transistor element.

10. The output buffer of claim 1 further comprising:

a relatively small current carrying capacity secondary pullup transistor element having its current path first and second terminal leads coupled in parallel with the current path first and second terminal leads of the primary pullup transistor element;

and a second output voltage sensing active switching circuit coupled in series between the control terminal leads of the secondary and primary pullup transistor elements, said second output voltage sensing active switching circuit switching between different conducting states in response to the voltage level at the output for controlling the conducting state of the primary pullup transistor element;

said secondary pullup transistor element control terminal lead being coupled in the output buffer to receive a signal propagating through the output buffer before the primary pullup transistor element control terminal lead to initiate a relatively small charging current from a power supply to the output before turn on of the relatively large charging current of the primary pullup transistor element by the second output voltage sensing active switching circuit;

said second output voltage sensing active switching circuit being responsive to the output voltage level for turning on the primary pullup transistor element during transition from logic low to high potential level at the output at a selected second threshold voltage level above said logic low potential level.

11. The output buffer of claim 10 wherein the second output voltage sensing active switching circuit comprises a second output voltage sensing switch transistor element having current path first and second terminal leads coupled in series between the control terminal leads of the secondary and primary pullup transistor elements, the control terminal lead of said second output voltage sensing switch transistor element being operatively coupled for sensing the voltage level at the output.

12. The output buffer of claim 10 wherein the primary and secondary pullup transistor elements are MOS transistor elements, and wherein the ratio of channel widths and therefore the ratio of current carrying capacities of the primary to secondary pullup transistor elements is at least approximately 4/1.

13. The output buffer of claim 11 wherein the ratio of channel widths and therefore current carrying capacities of the primary to secondary pullup transistor elements is in the range of approximately 4/1 to 7/1.

14. The output buffer of claim 10 further comprising a separate pullup delay passive resistance element of selected resistance value operatively coupled in series between the control terminal leads of the secondary and primary pullup transistor elements and in parallel with said second output voltage sensing active switching circuit.

15. The output buffer of claim 14 wherein the separate pullup delay passive resistance element is a P+ diffused resistor element.

16. The output buffer of claim 11 wherein the transistor elements comprise MOS transistor elements, wherein the primary and secondary pullup transistor elements comprise PMOS transistor elements, and wherein the second output voltage sensing active switching circuit comprises an NMOS transistor element having first and second terminal leads coupled in series between the control terminal leads of the secondary and primary pullup transistor elements and having the third control terminal lead coupled to the output for sensing the output voltage level.

17. The output buffer of claim 10 wherein the ratio of current carrying capacities of the primary and secondary pullup transistor elements and the value of the second threshold voltage level are selected so that the first negative power droop in potential (first $V_{cc}$ droop) caused by turn on of the secondary pullup transistor element and the second negative power droop in potential (second $V_{cc}$ droop) caused by turn on of the primary pulldown transistor element are substantially equal.

18. The output buffer of claim 1 further comprising a pulldown first bypass transistor element having its current path first and second terminal leads coupled between the control terminal lead of the primary pulldown transistor element and ground, and a pulldown bypass control circuit operatively coupling the control terminal lead of the first bypass transistor element to the control terminal lead of the secondary pulldown transistor element for rapidly turning off the primary pulldown transistor element during transition from logic low to high potential level at the output.

19. The output buffer of claim 10 further comprising a pullup second bypass transistor element having its current path first and second terminal leads coupled between the control terminal lead of the primary pullup transistor element and a high potential power supply, and a pullup bypass control circuit operatively coupling the control terminal lead of the second bypass transistor element to the control terminal lead of the secondary pullup transistor element for rapidly turning off the primary pullup transistor element during transition from logic high to low potential level at the output.

20. An output buffer for reducing switching induced noise in high speed integrated circuit devices, said output buffer having an input for receiving data signals of logic high and low potential levels, an output for delivering data signals propagated through the output buffer, a relatively large current carrying capacity primary pulldown transistor element operatively coupled at the output for sinking a relatively large discharge current from the output to ground, and a relatively large current carrying capacity primary pullup transistor element operatively coupled at the output for sourcing a relatively large charging current to the output from a power supply, each transistor element being characterized by a sourcing or sinking current path between first and second terminal leads and a third control terminal lead for controlling the current, the improvement comprising:

a relatively small current carrying capacity secondary pulldown transistor element having its current path first and second terminal leads coupled in parallel with the current path first and second terminal leads of the primary pulldown transistor element;

a first output voltage sensing active switching circuit operatively coupled in series between the control terminal leads of the secondary and primary pulldown transistor elements, said first output voltage sensing active switching circuit switching between different conducting states in response to the voltage level at the output for controlling the conducting state of the primary pulldown transistor element;

said secondary pulldown transistor element control terminal lead being coupled in the output buffer to receive a signal propagating through the output buffer before the primary pulldown transistor element control terminal lead to initiate a relatively small discharge current from the output before turn on of the relatively large discharge current of the primary pulldown transistor element by the first output voltage sensing active switching circuit;

said first output voltage sensing switching circuit also being coupled to the output and being responsive to the output voltage level for turning on the primary pulldown transistor element after the secondary pulldown transistor element during transition from logic high to low potential level at the output at a selected first threshold voltage level below said logic high potential level;

a separate pulldown delay passive resistive element of selected resistance value operatively coupled in series between the control terminal leads of the secondary and primary pulldown transistor elements and in parallel with said output voltage sensing active switching circuit;

the ratio of current carrying capacities of the primary and secondary pulldown transistor elements, the resistance value of the pulldown delay passive resistance element, and the value of the first threshold voltage level being selected so that the first positive ground rise in potential (first ground bounce) caused by turn on of the secondary pulldown transistor element and the second positive ground rise in potential (second ground bounce) caused by turn on of the primary pulldown transistor element, are substantially equal.

21. The output buffer of claim 20 wherein the transistor elements comprise MOS transistor elements, wherein the primary and secondary pulldown transistor elements comprise NMOS transistor elements, and wherein the first output voltage active switching circuit comprises a PMOS transistor element having first and second terminal leads coupled in series between the control terminal leads of the secondary and primary pulldown transistor elements and having the third control terminal lead coupled to the output for sensing the output voltage level.

22. An output buffer for reducing switching induced noise in high speed integrated circuit devices, said output buffer having an input for receiving data signals of logic high and low potential level, an output for delivering data signals propagated through the output buffer, a relatively large current carrying capacity primary pulldown transistor element operatively coupled at the output for sinking a relatively large discharge current from the output to ground, and a relatively large current carrying capacity primary pullup transistor element operatively occupied at the output for sourcing a relatively large charging current to the output from a power supply, each transistor element being characterized by a sourcing or sinking current path between first and second terminal leads, and a third control terminal lead for controlling the current, the improvement comprising:

a relatively small current carrying capacity secondary pullup transistor element having its primary current path first and second terminal leads coupled in parallel with the current path first and second terminal leads of the primary pullup transistor element;

a second output voltage sensing active switching circuit operatively coupled in series between the control terminal leads of the secondary and primary pullup transistor elements, said second output voltage sensing active switching circuit switching between different conducting states in response to the voltage level at the output for controlling the conducting state of the primary pullup transistor element;

said secondary pullup transistor element control terminal lead being coupled in the output buffer to receive a signal propagating through the output buffer before the primary pullup transistor element control terminal lead to initiate a relatively small charging current from a power supply to the output before turn on of the relatively large charging current of the primary pullup transistor element by the second output voltage sensing active switching circuit;

said second output voltage sensing active switching circuit also being coupled to the output and being responsive to the output voltage level for turning on the primary pullup transistor element after the secondary pullup transistor element during transition from logic low to high potential level at the output at a selected second threshold voltage level above said logic low potential level;

a separate pulldown delay passive resistance element of selected resistance value operatively coupled in series between the control terminal leads of the secondary and primary pulldown transistor elements and in parallel with said output voltage sensing switching circuit;

the ratio of current carrying capacities of the primary and secondary pullup transistor elements, the resistance value of the pulldown delay passive resistance element, and the value of the second threshold voltage level being selected so that the first negative power droop in potential (first $V_{cc}$ droop) caused by turn on of the secondary pullup transistor element and the second negative power droop in potential (second $V_{cc}$ droop) caused by turn on of the primary pulldown transistor element are substantially equal.

23. The output buffer of claim 22 wherein the transistor elements comprise MOS transistor elements, wherein the primary and secondary pullup transistor elements comprise PMOS transistor elements, and wherein the second output voltage sensing active switching circuit comprises an NMOS transistor element having current path first and second terminal leads coupled in series between the control terminal leads of the secondary and primary pullup transistor elements and having the third control terminal lead coupled to the output for sensing the voltage level at the output.

24. An output buffer for reducing switching induced noise in high speed integrated circuit devices, said output buffer having an input for receiving data signals of high and low potential, an output for delivering data signals propagated through the output buffer, relatively large current carrying capacity primary output transistor elements operatively coupled at the output for sinking a relatively large discharge current from the output to ground and sourcing a relatively large charging current to the output from a power supply, each transistor element being characterized by a sourcing or sinking current path between first and second terminal leads, and a third control terminal lead for controlling the conducting state of the current path, the improvement comprising:

at least one relatively small current carrying capacity secondary output transistor element having its current path first and second terminal leads coupled in parallel with the current path first and second terminal leads of a respective primary output transistor element;

and a first output voltage sensing active switching circuit coupled in series between the control terminal leads of the respective secondary and primary output transistor elements, said first output voltage sensing active switching circuit switching between different conducting states in response to the voltage level at the output for controlling the conducting state of the primary output transistor element;

said secondary output transistor element control terminal lead being coupled in the output buffer to receive a signal propagating through the output buffer before the primary output transistor element control terminal lead to initiate a relatively small sinking or sourcing current at the output before turn on of the relatively large sinking or sourcing current of the primary output transistor element by the first output voltage sensing active switching circuit;

said first output voltage sensing active switching circuit also being coupled to the output and being responsive to the output voltage level for turning on the primary output transistor element during transition at the output at a selected first threshold voltage difference.

25. The output buffer of claim 24 wherein the ratio of current carrying capacities of the primary and secondary output transistor elements and the value of the first threshold voltage level are selected so that the first noise peak caused by turn on of the secondary output transistor element and the second noise peak caused by turn on of the respective primary output transistor element, are substantially equal.

* * * * *